United States Patent
Zhao et al.

(10) Patent No.: US 8,008,740 B2
(45) Date of Patent: *Aug. 30, 2011

(54) LOW RESISTANCE TUNNELING MAGNETORESISTIVE SENSOR WITH COMPOSITE INNER PINNED LAYER

(75) Inventors: Tong Zhao, Fremont, CA (US); Hui-Chuan Wang, Pleasanton, CA (US); Kunliang Zhang, Milpitas, CA (US); Yu-Hsia Chen, Mountain View, CA (US); Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/586,523

(22) Filed: Sep. 23, 2009

(65) Prior Publication Data

US 2010/0019333 A1 Jan. 28, 2010

Related U.S. Application Data

(63) Continuation of application No. 11/811,930, filed on May 29, 2007, now Pat. No. 7,602,033.

(51) Int. Cl.
*H01L 43/00* (2006.01)
(52) U.S. Cl. ............... 257/427; 257/E29.167; 365/158; 365/171; 365/173
(58) Field of Classification Search .......... 257/427, 257/E29.167; 365/158, 171, 173
See application file for complete search history.

(56) References Cited

U.S. PATENT DOCUMENTS

| | | | |
|---|---|---|---|
| 6,493,196 B1 | 12/2002 | Noma et al. | |
| 6,841,395 B2 | 1/2005 | Linn et al. | |
| 6,995,960 B2 | 2/2006 | Seyama et al. | |
| 7,161,774 B2 | 1/2007 | Hayashi et al. | |
| 7,163,755 B2 | 1/2007 | Hiramoto et al. | |
| 7,234,228 B2 * | 6/2007 | Horng et al. | 29/603.08 |
| 7,256,971 B2 * | 8/2007 | Horng et al. | 360/324.11 |
| 7,423,848 B2 * | 9/2008 | Horng et al. | 360/324.1 |
| 7,602,033 B2 * | 10/2009 | Zhao et al. | 257/427 |
| 2004/0101978 A1 | 5/2004 | Linn et al. | |

(Continued)

OTHER PUBLICATIONS

"Giant room-temperature magnetoresistance in single-crystal Fe/MgO/Fe magnetic tunnel junctions," by Shinji Yuasa et al., 2004 Nature Publishing Group, nature materials / vol. 3 / Dec. 2004 / pp. 868-871, www.nature.com/naturematerials, Published online Oct. 31, 2004.

(Continued)

*Primary Examiner* — Ngan Ngo
(74) *Attorney, Agent, or Firm* — Saile Ackerman LLC; Stephen B. Ackerman

(57) ABSTRACT

A high performance TMR sensor is fabricated by employing a composite inner pinned (AP1) layer in an AP2/Ru/AP1 pinned layer configuration. In one embodiment, there is a 10 to 80 Angstrom thick lower CoFeB or CoFeB alloy layer on the Ru coupling layer, a and 5 to 50 Angstrom thick Fe or Fe alloy layer on the CoFeB or CoFeB alloy, and a 5 to 30 Angstrom thick Co or Co rich alloy layer formed on the Fe or Fe alloy. A MR ratio of about 48% with a RA of <2 ohm-um$^2$ is achieved when a CoFe AP2 layer, MgO (NOX) tunnel barrier, and CoFe/NiFe free layer are used in the TMR stack. Improved RA uniformity and less head noise are observed. Optionally, a CoFe layer may be inserted between the coupling layer and CoFeB or CoFeB alloy layer to improve pinning strength and enhance crystallization.

2 Claims, 3 Drawing Sheets

U.S. PATENT DOCUMENTS

| | | | |
|---|---|---|---|
| 2005/0201022 A1* | 9/2005 | Horng et al. | 360/324.11 |
| 2007/0015293 A1 | 1/2007 | Wang et al. | |
| 2007/0047159 A1 | 3/2007 | Zhao et al. | |
| 2007/0111332 A1 | 5/2007 | Zhao et al. | |

OTHER PUBLICATIONS

"Giant tunnelling magnetoresistance at room temperature with MgO (100) tunnel barriers," by Stuart S. P. Parkin et al., 2004 Nature Publishing Group, nature materials / vol. 3 / Dec. 2004 / pp. 862-867, www.nature.com/naturematerials, Published online Oct. 31, 2004.

"Giant tunneling magnetoresistance up to 410% at room temperature in fully epitaxial Co/MgO/Co magnetic tunnel junctions with bcc Co(001) electrodes," by Shinji Yuasa et al., Applied Physics Letters 89, 042505 (2006), pp. 1-3.

"230% room-temperature magnetoresistance in CoFeB/MgO/CoFeB magnetic tunnel junctions," by David D. Djayaprawira et al., Applied Physics Letters 86, 092502 (2005), pp. 1-3.

"Giant tunneling magnetoresistance effect in low-resistance CoFeB/MgO (001)/CoFeB magnetic tunnel junctions for read-head applications," by Koji Tsunekawa et al., Applied Physics Letters 87, 072503 (2005), pp. 1-3.

"Ultralow resistance-area product of 0.4 ohm(um)squared and high magnetoresistance above 50% in CoFeB/MgO/CoFeB magnetic tunnel junctions," by Yoshinori Nagamine et al., Applied Physics Letters 89, 162507 (2006), pp. 1-3.

* cited by examiner

LOW RESISTANCE TUNNELING MAGNETORESISTIVE SENSOR WITH COMPOSITE INNER PINNED LAYER

This is a continuation of U.S. patent application Ser. No. 11/811,930, filed on May 29, 2007 now U.S. Pat. No. 7,602,033, which is herein incorporated by reference in its entirety, and assigned to a common assignee.

RELATED PATENT APPLICATIONS

This application is related to the following: Ser. No. 11/181176, filing date Jul. 14, 2005; and Ser. No. 11/280523, filing date Nov. 16, 2005; both assigned to a common assignee, both of which are herein incorporated by reference in their entirety.

FIELD OF THE INVENTION

The invention relates to a high performance tunneling magnetoresistive (TMR) sensor in a read head and a method for making the same, and in particular, to a composite inner pinned layer that reduces the RA (resistance×area) value while maintaining a high MR ratio and reducing head noise.

BACKGROUND OF THE INVENTION

A TMR sensor otherwise known as a magnetic tunneling junction (MTJ) is a key component (memory element) in magnetic devices such as Magnetic Random Access Memory (MRAM) and a magnetic read head. A TMR sensor typically has a stack of layers with a configuration in which two ferromagnetic layers are separated by a thin non-magnetic dielectric layer. The sensor stack in a so-called bottom spin valve configuration is generally comprised of a seed (buffer) layer, anti-ferromagnetic (AFM) layer, outer pinned layer, coupling layer, inner pinned layer, barrier layer, free layer, and capping layer that are sequentially formed on a substrate. The free layer serves as a sensing layer that responds to external fields (media field) while the inner pinned layer is relatively fixed and functions as a reference layer. The electrical resistance through the barrier layer (insulator layer) varies with the relative orientation of the free layer moment compared with the reference layer moment and thereby converts magnetic signals into electrical signals. In a magnetic read head, the TMR sensor is formed between a bottom shield and a top shield. When a sense current is passed from the top shield to the bottom shield (or top conductor to bottom conductor in a MRAM device) in a direction perpendicular to the planes of the TMR layers (CPP designation), a lower resistance is detected when the magnetization directions of the free and reference layers are in a parallel state ("1" memory state) and a higher resistance is noted when they are in an anti-parallel state or "0" memory state. Alternatively, a TMR sensor may be configured as a current in plane (CIP) structure which indicates the direction of the sense current.

The outer pinned layer has a magnetic moment that is fixed in a certain direction by exchange coupling with the adjacent AFM layer that is magnetized in the same direction. Outer and inner pinned layers are magnetically coupled through a coupling layer that is typically Ru. The tunnel barrier layer is so thin that a current through it can be established by quantum mechanical tunneling of conduction electrons. A TMR sensor is currently the most promising candidate for replacing a giant magnetoresistive (GMR) sensor in upcoming generations of magnetic recording heads. An advanced TMR sensor may have a cross-sectional area of about 0.1 microns×0.1 microns at the air bearing surface (ABS) plane of the read head. The advantages of a TMR sensor are a higher MR ratio and the preference for CPP geometry for high recording density. A high performance TMR sensor requires a low areal resistance RA (area×resistance) value, high MR ratio, a soft free layer with low magnetostriction ($\lambda$), a strong pinned layer, and low interlayer coupling through the barrier layer. The MR ratio is dR/R where R is the minimum resistance of the TMR sensor and dR is the change in resistance observed by changing the magnetic state of the free layer. A higher dR/R improves the readout speed. For high recording density or high frequency applications, RA must be reduced to about 1 to 3 ohm-um$^2$. As a consequence, MR ratio drops significantly. To maintain a reasonable signal-to-noise (SNR) ratio, a novel magnetic tunneling junction (MTJ) with a lower RA value and higher MR ratio higher than provided by conventional MTJs is desirable.

A MgO based MTJ is a very promising candidate for high frequency recording applications because its tunneling magnetoresistive (TMR) ratio is significantly higher than for AlOx or TiOx based MTJs. A very high MR ratio has been reported by Yuasa et al. in "Giant room-temperature magnetoresistance in single crystal Fe/MgO/Fe magnetic tunnel junctions", Nature Materials 3, 868-871 (2004), and by Parkin et al. in "Giant tunneling magnetoresistance at room temperature with MgO (100) tunnel barriers", Nature Materials 3, 862-867 (2004). Yuasa and Parkin demonstrated that an MR ratio of ~200% can be achieved at room temperature in epitaxial Fe(001)/MgO(001)/Fe(001) and polycrystalline FeCo(001)/MgO(001)/(Fe$_{70}$Co$_{30}$)$_{80}$B$_{20}$ MTJs. Yuasa et al. also report a very high TMR ratio in "Giant tunneling magnetoresistance up to 410% at room temperature in fully epitaxial Co/MgO/Co magnetic tunnel junctions with bcc Co(001) electrodes", Applied Physics Letters 89, 042505 (2006). Meanwhile, Djayaprawira et al. in "230% room temperature magnetoresistance in CoFeB/MgO/CoFeB magnetic tunnel junctions", Appl. Physics Letters 86, 092502 (2005) showed that MTJs having a CoFeB/MgO(001)/CoFeB structure made by conventional sputtering can also have a very high MR ratio with the advantages of better feasibility and uniformity. However, RA values in the MTJs mentioned above are in the range of 240 to 10000 ohm-um$^2$ which is too high for read head applications. To solve this issue, Tsunekawa et al. in "Giant tunneling magnetoresistance effect in low resistance CoFeB/MgO(001)/CoFeB magnetic tunnel junctions for read head applications", Applied Physics Letters 87, 072503 (2005) found a reduction in RA by inserting a DC-sputtered metallic Mg layer between a bottom CoFeB layer and rf-sputtered MgO. The Mg layer improves the crystal orientation of the MgO(001) layer when the MgO(001) layer is thin. The MR ratio of CoFeB/Mg/MgO/CoFeB MTJs can reach 138% at RA=2.4 ohm-um$^2$. The idea of metallic Mg insertion was initially disclosed by Linn in U.S. Pat. No. 6,841,395 to prevent oxidation of the bottom electrode (CoFe) in a CoFe/MgO(reactive sputtering)/NiFe structure. Alternatively, a Ta getter pre-sputtering prior to the rf-sputtering of the MgO layer can also achieve 55% TMR ratio with low RA as recently reported by Y. Nagamine et al. in "Ultralow resistance-area product of 0.4 ohm-um$^2$ and high magnetoresistance above 50% in CoFeB/MgO/CoFeB magnetic junctions", Appl. Physics Letters 89, 162507 (2006).

Although a high MR ratio and low RA have been demonstrated in MTJs having a MgO barrier layer, there are still many issues to be resolved before such configurations can be implemented in a TMR sensor of a read head. For example, the annealing temperature needs to be lower than 300° C. for read head processing, and rf-sputtered MgO barriers make control of RA mean and uniformity more difficult than with conventional DC-sputtered and subsequently naturally oxidized AlOx barriers. Moreover, a CoFe/NiFe free layer is preferred over CoFeB for low λ and soft magnetic properties but when using a CoFe/NiFe free layer in combination with a MgO barrier, the MR ratio will degrade to very near that of a conventional AlOx MTJ. Thus, a TMR sensor is needed that incorporates a MgO barrier without compromising any desirable properties such as high MR ratio, a low RA value, and low magnetostriction.

In other prior art, a free layer having a trilayer CoFe/CoFeB/NiFe configuration is disclosed in U.S. Patent Application 2007/0047159.

U.S. Pat. No. 6,493,196 teaches a pinned layer comprising CoFeB/Ru/CoFeB or CoFe/Ru/CoFeB structure. In U.S. Pat. No. 6,995,960, a CoFeB/Ru/CoFeB pinned layer is disclosed.

U.S. Pat. No. 7,161,774 teaches the use of alloys and amorphous materials such as NiFe, Co, CoFe, NiFeCo, FeCo, CoFeB, CoZrMo, CoZrNb, CoZr, CoZrTa, CoTaHf, CoNbHf, CoHfPd, CoTaZrNb, and CoZrMoNi for forming a fixed layer. Composite pinned layers (AP2/coupling layer/AP1) including Co/Ru/Co, CoFe/Ru/CoFe, and CoFeNi/Ru/CoFeNi are described but there is no suggestion of a composite AP1 layer.

U.S. Pat. No. 7,163,755 discloses that a pinned layer may include CoFeB, a Fe-based material, or a material containing at least 50% by weight of Fe, Co, or Ni.

SUMMARY OF THE INVENTION

One objective of the present invention is to provide a TMR sensor with a composite inner pinned layer to reduce the RA value while maintaining a high MR ratio and reducing noise compared with prior art MTJs having a conventional pinned layer.

A second objective of the present invention is to provide a TMR sensor with a composite inner pinned layer according to the first objective that may be modified through various embodiments to optimize certain properties such as pinning and crystallization.

A further objective of the present invention is to provide a method of forming a TMR sensor that satisfies the first and second objectives and is cost effective.

According to a first embodiment, these objectives are achieved by forming a TMR sensor on a suitable substrate such as a bottom shield in a read head. The TMR sensor may have a bottom spin valve configuration comprised of a seed layer, AFM layer, pinned layer, tunnel barrier layer, free layer, and capping layer which are formed sequentially on the bottom shield. The pinned layer preferably has an AP2/coupling/AP1 configuration in which the coupling layer is Ru and the AP1 (inner pinned) layer has a composite structure with a CoFeB/Fe/Co configuration. The bottom layer of the composite inner pinned layer is defined as the layer adjacent to the Ru coupling layer and in a first embodiment has a composition represented by $Co_{(100-x-y)}Fe_xB_y$ where x is 5 to 95 atomic %, and y is 5 to 40 atomic %. In a second embodiment, the CoFeB layer may be comprised of one or more additional elements including but not limited to Ni, Zr, Hf, Ta, Mo, Nb, Pt, Cr, Si, and V. The second layer or layer adjacent to the bottom layer in the composite pinned layer may be Fe or a Fe alloy with one or more other elements such as Co, Ni, or B in which the Fe content is at least 25 atomic %. The third layer in the composite pinned layer is adjacent to the tunnel barrier layer and is preferably Co or a Co rich alloy wherein the Co content is $\geq 90$ atomic %.

In another embodiment, an additional layer may be added between the CoFeB layer and the Ru coupling layer. For example, a CoFe layer may be inserted between the coupling layer and CoFeB layer to enhance crystallization and pinning strength with the outer pinned layer.

The barrier layer may be comprised of a Mg/MgO/Mg stack in which the Mg layers are formed by a DC magnetron sputtering method and the MgO layer is made by a natural oxidation process of the lower Mg layer. A CoFe/NiFe free layer is preferred for low magnetostriction.

The present invention also encompasses an inner pinned layer composite made of two layers represented by a CoFeB/Co configuration. Preferably, a crystallized and highly spin polarized layer is formed between the CoFeB and Co layers during the annealing process.

Typically, a TMR stack of layers is laid down in a sputtering system. All of the layers may be deposited in the same sputter chamber. However, the natural oxidation process on the lower Mg layer to form a MgO layer thereon is preferably done in an oxidation chamber within the sputtering system. The TMR stack is patterned by a conventional method prior to forming a top shield on the cap layer.

DETAILED DESCRIPTION OF THE INVENTION

The present invention is a high performance TMR sensor having a composite inner pinned (AP1) layer comprised of a CoFeB/Fe/Co stack and a method for making the same. While the exemplary embodiment depicts a TMR sensor in a read head, the present invention may be employed in other devices based on a tunneling MR element such as MRAM structures. The TMR sensor may have a bottom spin valve, top spin valve, or multilayer spin value configuration as appreciated by those skilled in the art. The drawings are provided by way of example and are not intended to limit the scope of the invention. For example, the various elements are not necessarily drawn to scale and their relative sizes may differ compared with those in an actual device.

Figure 1:
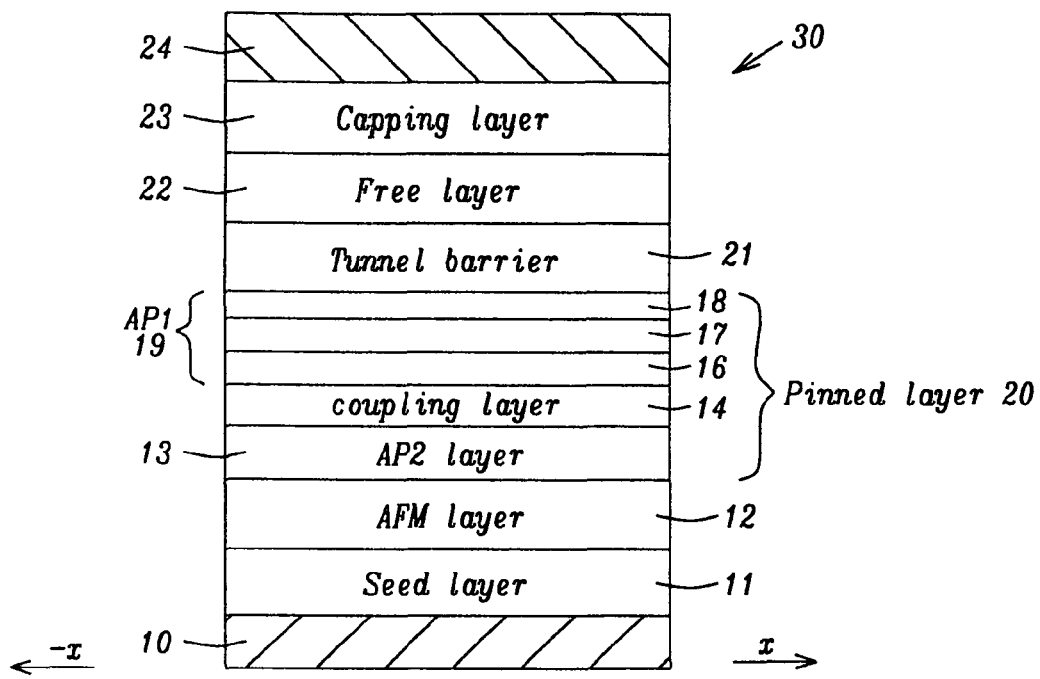
FIG. 1 is a cross-sectional view showing a TMR sensor having a composite inner pinned layer according to one embodiment of the present invention.

Referring to FIG. 1, a portion of a partially formed TMR read head 30 of the present invention is shown from the plane of an air bearing surface (ABS). There is a substrate 10 that in one embodiment is a bottom lead otherwise known as a bottom shield (S1) which may be a NiFe layer about 2 microns thick that is formed by a conventional method on a substructure (not shown). It should be understood that the substructure may be comprised of a wafer made of AlTiC, for example.

A TMR stack is formed on the substrate 10 and in the exemplary embodiment has a bottom spin valve configuration wherein a seed layer 11, AFM layer 12, pinned layer 20, tunnel barrier layer 21, free layer 22, and capping layer 23 are sequentially formed on the substrate. The seed layer 11 which has a thickness of about 10 to 100 Angstroms is preferably a Ta/Ru composite but Ta, Ta/NiCr, Ta/Cu, or Ta/Cr may be used, instead. The seed layer 11 serves to promote a smooth and uniform grain structure in overlying layers. Above the seed layer 11 is an AFM layer 12 used to pin the magnetization direction of the overlying pinned layer 20, and in particular, the outer portion or AP2 layer 13. The AFM layer 12 has a thickness from 40 to 300 Angstroms and is preferably comprised of IrMn. Optionally, one of MnPt, NiMn, OsMn, RuMn, RhMn, PdMn, RuRhMn, or MnPtPd may be employed as the AFM layer.

The pinned layer 20 preferably has a synthetic anti-parallel (SyAP) configuration represented by AP2/Ru/AP1 where a coupling layer 14 is sandwiched between an AP2 layer 13 and an AP1 layer 19. The AP2 layer 13(outer pinned layer) is formed on the AFM layer 12 and may be made of CoFe with a composition of about 10 atomic % Fe and with a thickness of about 10 to 50 Angstroms. The magnetic moment of the AP2 layer 13 is pinned in a direction anti-parallel to the magnetic moment of the AP1 layer 19. For example, the AP2 trilayer may have a magnetic moment oriented along the "+x" direction while the AP1 layer has a magnetic moment in the "−x" direction. Note that all of the layers 16, 17, 18 in the AP1 trilayer 19 have a magnetic moment in the same direction. A slight difference in thickness between the AP2 and AP1 layers produces a small net magnetic moment for the SyAP pinned layer 20 along the easy axis direction of the TMR sensor to be patterned in a later step. Exchange coupling between the AP2 layer and the AP1 layer is facilitated by a coupling layer 14 that is preferably comprised of Ru with a thickness of from 3 to 9 Angstroms although Rh or Ir may be used instead. A key feature of the present invention is the composite AP1 layer 19 (inner pinned layer) which in one embodiment has a trilayer configuration (CoFeB/Fe/Co) in which a lower layer 16 made of CoFeB is formed on the coupling layer 14 and has a thickness between 10 and 80 Angstroms and a composition represented by $Co_{(100-X-Y)}Fe_XB_Y$ where x is 5 to 95 atomic %, and y is 5 to 40 atomic %. In a second embodiment, the lower layer 16 may be comprised of a CoFeBM alloy where M is one or more elements including but not limited to Ni, Zr, Hf, Ta, Mo, Nb, Pt, Cr. Si, and V. The CoFeB or CoFeBM lower layer 16 is amorphous and provides a smooth template to enable a more uniform pinned layer 20 than would result if a CoFe layer, for example, were employed as the AP1 layer. The middle layer 17 in the AP1 trilayer is formed on the lower layer 16 and has a thickness from 5 to 50 Angstroms and may be Fe, or a Fe alloy with one or more other elements such as Co, Ni, or B in which the Fe content is at least 25 atomic %. The upper layer 18 in the composite AP1 layer 19 is adjacent to the tunnel barrier layer 21 and is preferably Co or a Co rich alloy having a thickness between 5 and 30 Angstroms wherein the Co content is $\geqq 90$ atomic %. Although the inventors are not bound by any particular theory, it is believed that the middle layer 17 and upper layer 18 provide a crystallized body centered cubic (bcc)-like layer with a high spin polarization even under low annealing temperatures. Moreover, the upper layer 18 made of Co or Co alloy at the interface with the tunnel barrier layer 21 can prevent formation of FeO in the Fe middle layer 17 which is advantageous since FeO may contribute to a higher RA and increase noise.

Note that "inner pinned layer" is meant to indicate the portion of the pinned layer that is closest to the barrier layer and "outer pinned layer" is meant to signify the portion of the pinned layer farthest from the barrier layer. In the exemplary embodiment that features a bottom spin valve configuration, the tunnel barrier layer 21 having a Mg/MgO/Mg stack of layers is formed on the composite AP1 layer 19. In a top spin valve configuration, the TMR stack according to one embodiment of the present invention would involve the sequential deposition of a seed layer, free layer, Mg/MgO/Mg barrier layer, pinned layer with an AP1/Ru/AP2 configuration, an AFM layer, and a cap layer on the substrate. In a top spin valve, the AP1 layer (inner pinned layer) is disposed on the upper Mg layer in the Mg/MgO/Mg tunnel barrier stack.

The present invention also encompasses an embodiment wherein the composite AP1 layer 19 is comprised of two layers (not shown) featuring a bottom CoFeB layer on the coupling layer 14 and a Co or CoFe layer adjacent to the tunnel barrier layer 21. In this case, the composition of the CoFeB layer, the Co layer thickness, and annealing temperature are chosen so that upon annealing, a crystallized and high spin-polarization layer is formed between the CoFeB and Co layers. A Co rich top interface is preserved for better uniformity and a noise reduction advantage. This embodiment was previously disclosed in Headway patent application HT05-023 which is herein incorporated by reference in its entirety.

Figure 2:
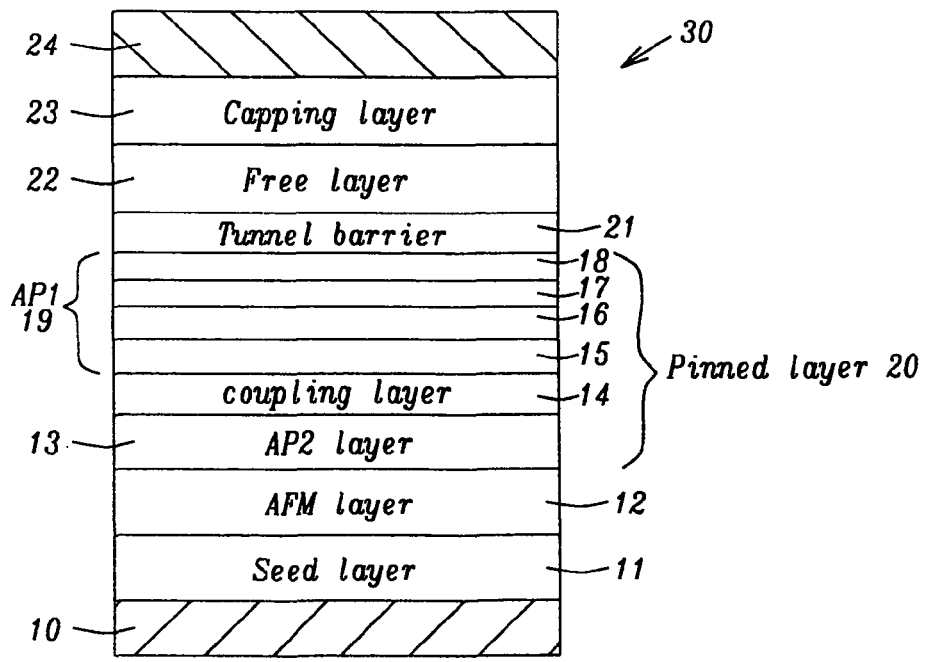
FIG. 2 is a cross-sectional view showing a TMR sensor having a composite inner pinned layer according to a second embodiment of the present invention.
Figure 3:
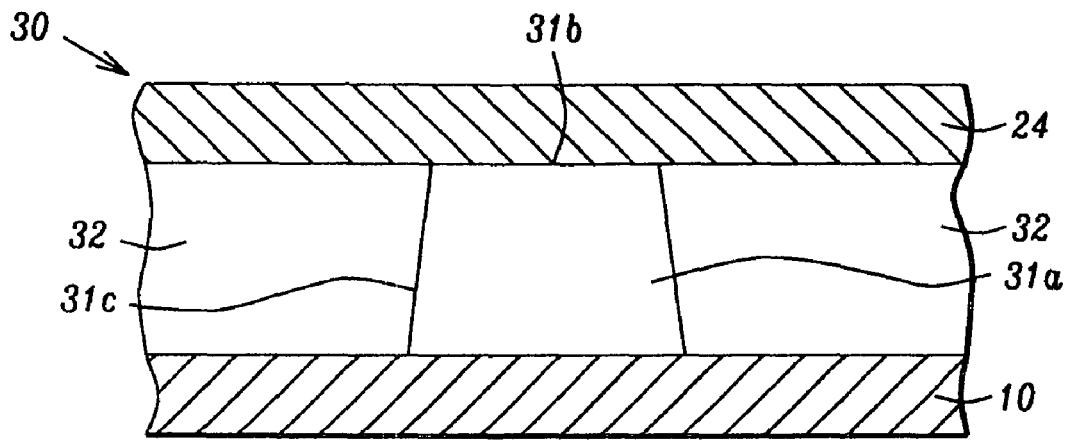
FIG. 3 is a cross-sectional view of a TMR read head having a TMR sensor interposed between a top shield and bottom shield and formed according to the present invention.

Furthermore, the present invention encompasses an embodiment wherein the composite AP1 layer 19 is comprised of more than three layers. Referring to FIG. 2, the composite AP1 layer 19 comprises a fourth layer that is a CoFe layer 15 at the bottom of the AP1 layer stack. In this configuration, the CoFe layer 15, CoFeB or CoFeBM layer 16, Fe or Fe alloy layer 17, and Co or Co alloy layer 18 are sequentially formed on the coupling layer 14. The addition of CoFe layer 15 may be employed to enhance the pinning of composite AP1 layer 19 by AFM layer 12 (through AP2 layer 13 and coupling layer 14) and to improve crystallization of layers within the composite AP1 layer. In other words, the bcc crystal structure of CoFe layer 15 may promote bcc crystal growth in overlying AP1 layers 16-18.

Figure 5:
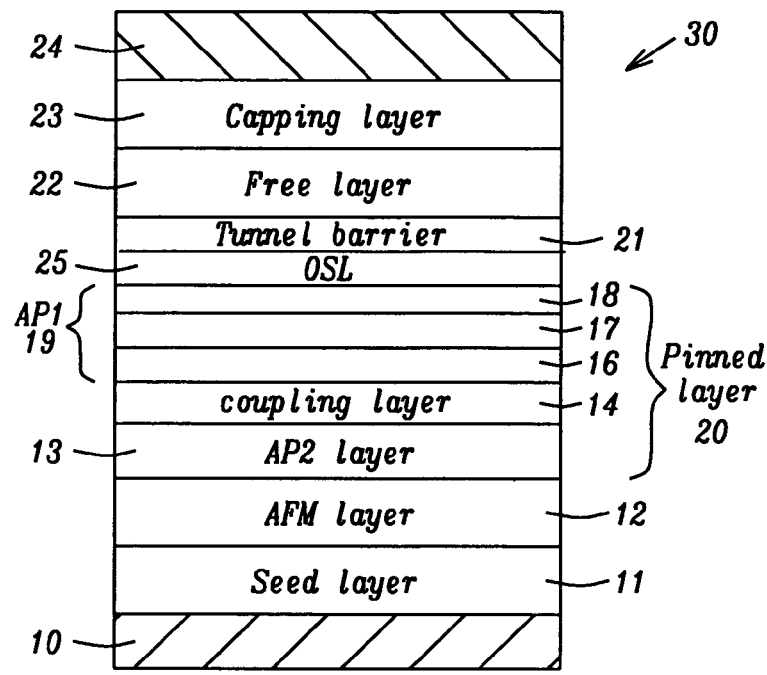
FIG. 5 is a cross-sectional view showing a TMR sensor with an oxygen surfactant layer formed on a composite inner pinned layer according to an embodiment of the present invention.
Figure 6:
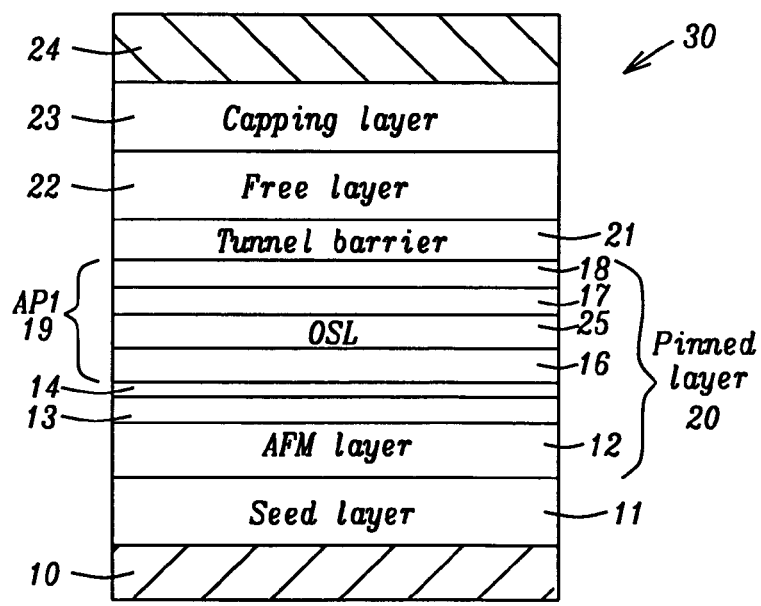
FIG. 6 is a cross-sectional view showing a TMR sensor with a composite inner pinned layer comprised of an oxygen surfactant layer according to an embodiment of the present invention.

Referring to FIGS. 5-6, the present invention also anticipates that an oxygen surfactant layer or OSL may be formed on or within the composite AP1 layer 19 to improve film uniformity in overlying layers and especially in a metal oxide tunnel barrier layer as previously described in related Headway application HT05-023. In FIG. 5, an OSL 25 is formed on a top surface of AP1 layer 19 and adjoins a bottom surface of tunnel barrier 21. In FIG. 6, an OSL 25 is inserted between AP1 layers 16, 17, for example, and is considered to be within composite AP1 layer 19. It should be appreciated by those skilled in the art that a plasma treatment using Ar gas or the like may be employed to modify any of the composite inner pinned layers in order to promote smoother growth and/or a better crystal structure. For example, a plasma treatment may be performed on AP1 layer 16 prior to deposition of AP1 layer 17.

The present invention also anticipates that an oxygen surfactant layer or OSL (not shown) may be formed on or within the composite AP1 layer 19 to improve film uniformity in overlying layers and especially in a metal oxide tunnel barrier layer as previously described in related Headway application HT05-023. It should be appreciated by those skilled in the art that a plasma treatment using Ar gas or the like may be employed to modify any of the composite inner pinned layers in order to promote smoother growth and/or a better crystal structure. For example, a plasma treatment may be performed on AP1 layer 16 prior to deposition of AP1 layer 17. Preferably, the tunnel barrier layer 21 formed on the composite AP1 layer 19 has a Mg/MgO/Mg configuration. The first or lower Mg layer (not shown) is preferably between 4 and 14 Angstroms thick and is deposited in a DC sputtering chamber of a sputtering system such as an Anelva C-7100 sputter deposition system which includes ultra high vacuum DC magnetron sputter chambers with multiple targets and at least one oxidation chamber. In the exemplary embodiment, the lower Mg layer is deposited on the composite AP1 layer 19. Typically, the sputter deposition process involves an argon sputter gas and a base pressure between $5\times10^{-8}$ and $5\times10^{-9}$ torr. A lower pressure enables more uniform films to be deposited.

The second step in the barrier layer formation sequence is a natural oxidation (NOX) process of the first Mg layer to form a MgO layer thereon as described previously in Headway patent application HT05-045 which is herein incorporated by reference in its entirety. The NOX process is performed in an oxidation chamber of the sputter deposition system using an oxygen pressure of 0.1 mTorr to 1 Torr for about 15 to 300 seconds. In the exemplary embodiment, no heating or cooling is applied to the oxidation chamber during the NOX process. The resulting MgO layer has a thickness of about 5 to 12 Angstroms. Oxygen pressure between 10-6 and 1 Torr is preferred for a reasonable oxidation time in order to achieve a RA in the range of 0.5 to 5 ohm-um$^2$. A mixture of $O_2$ with other inert gases such as Ar, Kr, or Xe may also be used for better control of the oxidation process.

The present invention anticipates that a Mg/MgO/Mg barrier layer 21 according to a second embodiment of the present invention could be formed by depositing a MgO layer on the first Mg layer with a rf-sputtering or reactive sputtering method. It should be understood that the performance of a TMR sensor fabricated with a barrier layer comprised of sputtered MgO will not be as desirable as one made according to the preferred embodiment of this invention. For example, the inventors have observed that the final RA uniformity (1σ) of 0.6 um circular devices is more than 10% when the MgO tunnel barrier layer is rf-sputtered and less than 3% when the MgO tunnel barrier is formed by DC sputtering a Mg layer followed by a NOX process.

For the third step in the tunnel barrier layer 21 formation process, a second Mg layer (not shown) is deposited on the MgO layer by a DC sputtering process. The second Mg layer has a thickness between 2 and 8 Angstroms and serves to protect the subsequently deposited free layer from oxidation. It is believed that excessive oxygen accumulates at the top surface of the MgO layer as a result of the NOX process and this oxygen can oxidize a free layer that is formed directly on the MgO portion of the barrier layer. Note that the RA and MR ratio for the TMR sensor may be adjusted by varying the thickness of the two Mg layers in tunnel barrier layer 21 and by varying the natural oxidation time and pressure. For example, a thicker MgO layer resulting from longer oxidation time and/or higher pressure would increase the RA value.

Those skilled in the art will appreciate that other materials such as TiOx, TiAlOx, MgZnOx, AlOx, or any combination of the aforementioned materials including MgO may be used as the tunnel barrier layer 21.

Returning to FIG. 1, a free layer 22 is formed on the barrier layer 21 and is preferably comprised of $Co_{100-w}Fe_w/Ni_{100-z}Fe_z$ wherein w is from about 10 to 90 atomic % and z is from about 5 to 70 atomic %. Optionally, the free layer 22 may be a multilayered structure of alloys including at least two of the elements Co, Fe, Ni, and B. The free layer 22 has a thickness in the range of 10 to 90 Angstroms. Above the free layer is a cap layer 23 that may have a Ru/Ta, Ru/Zr, Ru/Hf, Ta, NiFeHf, NiFeZr, or NiFeMg configuration, for example. In one embodiment, the free layer 22 and cap layer 23 are deposited in the same sputtering chamber as the layers 11-20. Optionally, all of the sputter deposited layers in the TMR stack may be deposited in more than one sputter chamber in the same sputter deposition system or mainframe.

Once the TMR stack is complete, the partially formed read head 30 may be annealed in a vacuum oven within the range of 240° C. to 340° C. with an applied magnetic field of at least 2000 Oe, and preferably 8000 Oe for about 2 to 10 hours to set the pinned layer and free layer magnetization directions. It should be understood that under certain conditions, depending upon the time and temperature involved in the anneal process, the Mg/MgO/Mg tunnel barrier may become a uniform MgO tunnel barrier layer as unreacted oxygen diffuses into the adjacent Mg layers.

Figure 4:
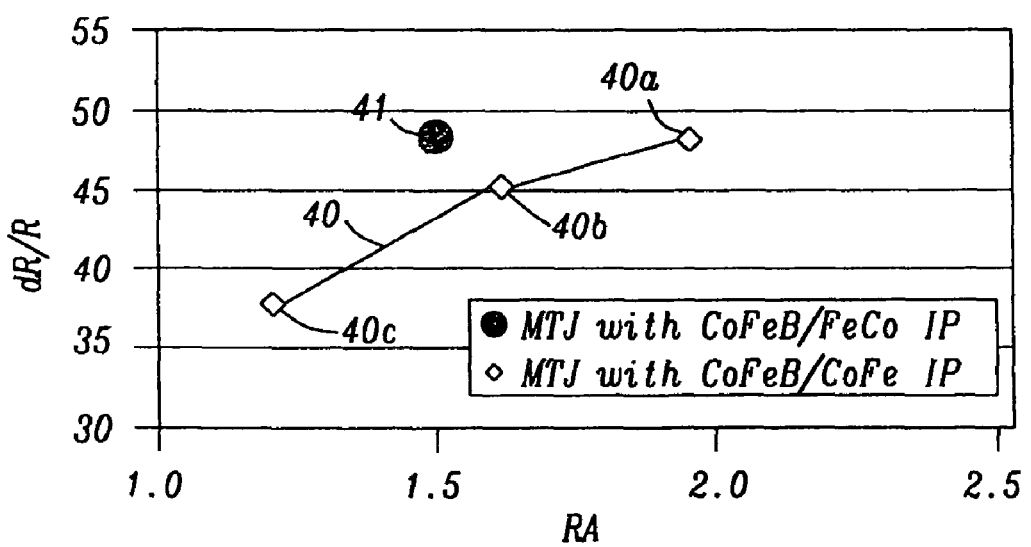
FIG. 4 is a graph showing a lower RA value is achieved while maintaining a high dR/R ratio for a TMR sensor formed according to the present invention

Next, the TMR stack is patterned by following a conventional process sequence. For example, a photoresist layer (not shown) may be applied on the cap layer 23. After the photoresist layer is patterned, a reactive ion etch (RIE), ion beam etch (IBE), or the like is used to remove underlying layers in the TMR stack that are exposed by openings in the photoresist layer. The etch process stops on the bottom shield 10 or between the bottom shield and a barrier layer (not shown) to give a TMR sensor 31a with a top surface 31b and sidewalls 31c as shown in FIG. 4. Thereafter, an insulating layer 32 may be deposited along the sidewalls of the TMR sensor 31a. The photoresist layer is subsequently removed by a lift off process.

A top lead otherwise known as a top shield 24 is then deposited on the insulating layer 32 and TMR element 31a. Similar to the bottom shield 10, the top shield 24 may also be a NiFe layer about 2 microns thick. The TMR read head 30 may be further comprised of a second gap layer (not shown) disposed on the top shield 24.

An experiment was conducted to demonstrate the improved performance achieved by implementing a composite inner pinned layer in a TMR sensor according to the present invention. A TMR stack of layers, hereafter referred to as MTJ Sample 1, was fabricated as in the exemplary embodiment described previously and has a Ta/Ru/IrMn/CoFe/Ru/CoFeB/Fe/Co/Mg/MgO/Mg/CoFe/NiFe/cap configuration. The composite AP1 layer has a CoFeB/Fe/Co configuration wherein the thicknesses of the $Co_{24}Fe_{56}B_{20}$, Fe, and Co layers are 15 Angstroms, 10 Angstroms, and 7 Angstroms, respectively. The Mg/MgO/Mg barrier is comprised of a 7 Angstrom thick lower Mg layer that was subjected to a NOX process and a 3 Angstrom thick upper Mg layer. The thicknesses in Angstroms of the other layers are given in parentheses: Ta(20)/Ru(20) seed layer; IrMn (70) AFM layer; CoFe (19) AP2 layer; Ru (7.5) coupling layer; CoFe(10)/NiFe (40) free layer; and Ru(10)/Ta(60) cap layer. The TMR stack was formed on a NiFe shield and was annealed under vacuum at 280° C. for 5 hours with an applied field of 8000 Oe. The advantages of the present invention are that a high MR ratio of greater than 40% can be achieved simultaneously with a low RA value (<2 ohm-um$^2$) and low magnetostriction which is a significant improvement over conventional TMR sensors (MTJs) based on AlOx barrier layers.

Referring to FIG. 4, the performance MTJ Sample 1 is improved over other MTJs containing a MgO tunnel barrier layer previously fabricated by the inventors. The MTJs represented by the line 40 were all formed with the same configuration as in MTJ Sample 1 except that a CoFeB/CoFe inner pinned (AP1) layer was employed rather than a CoFeB/Fe/Co AP1 layer. Data points 40a-40c were all generated using the same sensor structure except a different NOX process time was employed during formation of the Mg/MgO/

Mg tunnel barrier layer. Data point 41 indicates the MR ratio and RA value associated with MTJ Sample 1. Note that at the same dR/R of about 48%, MTJ Sample 1 has a substantially lower RA value than for the reference MTJ at data point 40a. Additionally, an acceptable magnetrostriction of <$2\times10^6$ on a 0.6 um circular device was achieved with a MTJ formed according to the present invention. It should be understood that the magnetostriction value may be adjusted by varying the thickness or composition of the CoFe and NiFe layers in the free layer. The inventors have found that the combination of a high MR ratio above 40%, a low RA value less than 2 ohm-um$^2$ with good uniformity, and a low magnetostriction is realized only by implementing a composite AP1 layer as described herein with a Mg/MgO(NOX)/Mg tunnel barrier layer or the like.

Another advantage of the present invention is that the composite AP1 layer of the various embodiments is cost effective. Compared with a process previously practiced by the inventors, the TMR sensor disclosed herein involves only one or two additional layers which do not require any new sputtering targets or sputter chambers. Moreover, the low temperature anneal enabled by the CoFe/NiFe free layer means that the annealing process can be kept the same as for GMR sensors that are currently produced. Therefore, there is no change in process flow and related processes compared with current manufacturing schemes.

Yet another advantage of the preferred embodiment is that the MgO tunnel barrier layer in the present invention has a more uniform thickness and oxidation state than rf sputtered MgO layers because it is formed by a natural oxidation method. As a result, the tunneling resistance of the barrier layer is controlled within tighter limits and better control leads to higher performance.

While this invention has been particularly shown and described with reference to, the preferred embodiment thereof, it will be understood by those skilled in the art that various changes in form and details may be made without departing from the spirit and scope of this invention.

We claim:

1. A pinned layer in a magnetoresistive element of a magnetic device, comprising:
   (a) an outer pinned (AP2) layer;
   (b) a coupling layer having one side formed on the AP2 layer; and
   (c) an inner pinned (AP1) layer formed on a side of the coupling layer opposite the AP2 layer, said AP1 layer has a composite configuration comprised of at least a (1) a CoFeB or CoFeB alloy layer;
   (2) a Fe or Fe alloy layer formed on the CoFeB or CoFeB alloy layer;
   (3) a Co or Co alloy layer formed on the Fe or Fe alloy layer wherein said Co or Co alloy layer contacts a tunnel barrier layer in the magnetoresistive element, and
   (4) an oxygen surfactant layer.

2. A TMR sensor in a magnetic device, comprising:
   a seed layer, AFM layer, pinned layer, tunnel barrier layer, free layer, and capping layer that are sequentially formed on a substrate, said pinned layer is comprised of
   (a) an outer pinned (AP2) layer formed on the AFM layer;
   (b) a coupling layer having one side formed on the AP2 layer; and
   (c) an inner pinned (AP1) layer formed on a side of the coupling layer opposite the AP2 layer, said AP1 layer has a composite configuration comprised of at least
   (1) a CoFeB or CoFeB alloy layer;
   (2) a Fe or Fe alloy layer formed on the CoFeB or CoFeB alloy layer;
   (3) a Co or Co alloy layer formed on the Fe or Fe alloy layer wherein said Co or Co alloy layer contacts the tunnel barrier layer, and
   (4) an oxygen surfactant layer.

* * * * *